United States Patent
Tuor et al.

(10) Patent No.: US 10,379,134 B2
(45) Date of Patent: Aug. 13, 2019

(54) SENSOR DEVICE FOR DETERMINING ROTATIONAL SPEED OF A ROTATABLE OBJECT AND TURBOCHARGER WITH SUCH A SENSOR DEVICE

(71) Applicant: Jaquet Technology Group AG, Basel (CH)

(72) Inventors: Andreas Tuor, Lausanne (CH); Oliver Hirsch, Schallbach (CH); Markus Eigenmann, Arlesheim (CH); Albert Peter, Seltisberg (CH)

(73) Assignee: Jaquet Technology Group AG, Basel (CH)

( * ) Notice: Subject to any disclaimer, the term of this patent is extended or adjusted under 35 U.S.C. 154(b) by 721 days.

(21) Appl. No.: 14/911,833

(22) PCT Filed: Aug. 21, 2014

(86) PCT No.: PCT/CH2014/000124
§ 371 (c)(1),
(2) Date: Feb. 12, 2016

(87) PCT Pub. No.: WO2015/027348
PCT Pub. Date: Mar. 5, 2015

(65) Prior Publication Data
US 2016/0187366 A1 Jun. 30, 2016

(30) Foreign Application Priority Data
Aug. 29, 2013 (CH) ........................ 1471/13

(51) Int. Cl.
*G01P 3/495* (2006.01)
*F01D 17/06* (2006.01)
(Continued)

(52) U.S. Cl.
CPC .............. *G01P 3/495* (2013.01); *F01D 17/06* (2013.01); *F01D 21/003* (2013.01); *F04D 17/10* (2013.01);
(Continued)

(58) Field of Classification Search
None
See application file for complete search history.

(56) References Cited

U.S. PATENT DOCUMENTS

| 2,869,851 A | 1/1959 | Sedgfield et al. |
| 5,631,557 A | 5/1997 | Davidson |

(Continued)

FOREIGN PATENT DOCUMENTS

| CN | 101976723 A | 2/2011 |
| DE | 10 2009 027 853 A1 | 1/2011 |

(Continued)

OTHER PUBLICATIONS

Flandre, Science and Technology of Semiconductor-On-Insulator Structures and Devices Operating in a Harsh Environment, Apr. 2004, "NATO Science Series, II. Mathematics, Physics and Chemistry—vol. 185", pp. 1-10, https://link.springer.com/content/pdf/10.1007%2F1-4020-3013-4.pdf.*

(Continued)

*Primary Examiner* — Woody A Lee, Jr.
*Assistant Examiner* — Jason A Fountain
(74) *Attorney, Agent, or Firm* — Collard & Roe, P.C.

(57) ABSTRACT

A sensor device for determining rotational speed of a rotatable object, includes a sensor housing with a sensor segment, a mounting segment and a connector segment, the sensor segment and the connector segment being arranged on opposite sides of the mounting segment, wherein a sensing element is arranged at the sensor tip of the sensor segment, sensor electronics are arranged inside the sensor (Continued)

Figure 1:
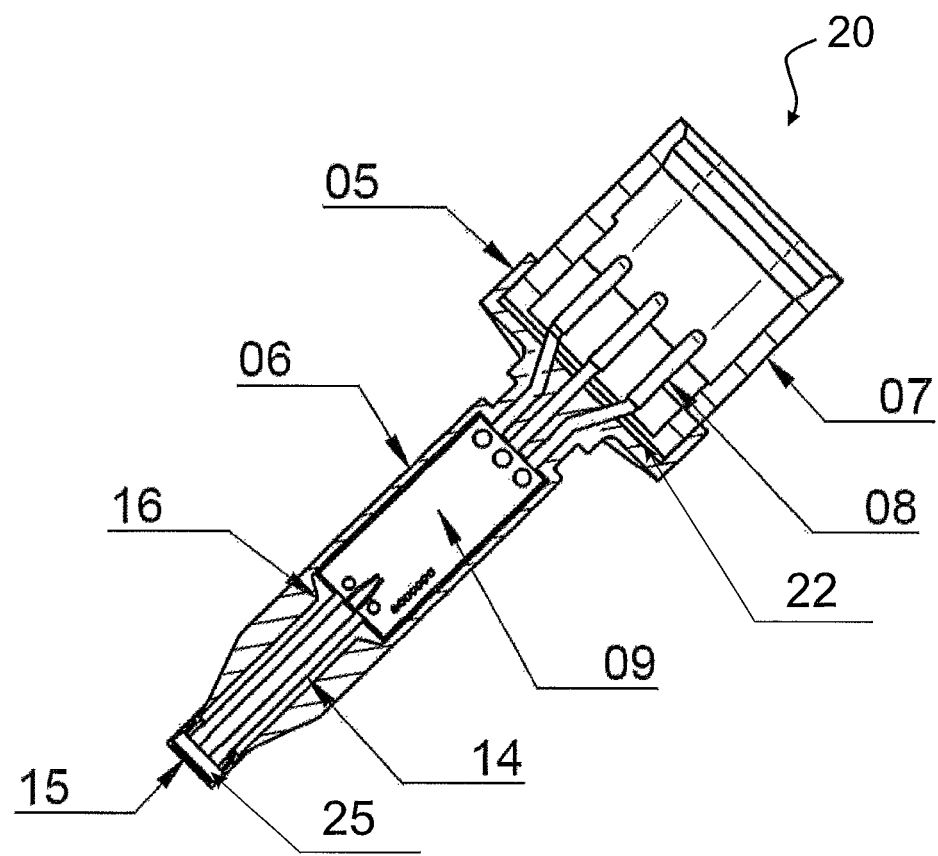

segment, the sensor electronics including an integrated silicon-on-insulator circuit. The integrated silicon-on-insulator circuit is embedded between flexible polymer substrates. A turbocharger may include such a sensor device. The sensor device is designed to operate continuously at a temperature of at least 200° C.

12 Claims, 9 Drawing Sheets

(51) Int. Cl.
    *G01P 1/02*     (2006.01)
    *G01P 3/49*     (2006.01)
    *F01D 21/00*     (2006.01)
    *F04D 17/10*     (2006.01)
    *F04D 29/28*     (2006.01)
    *F04D 29/42*     (2006.01)
    *H05K 1/18*     (2006.01)
    *H05K 1/16*     (2006.01)

(52) U.S. Cl.
    CPC ....... *F04D 29/284* (2013.01); *F04D 29/4206* (2013.01); *G01P 1/026* (2013.01); *G01P 3/49* (2013.01); *F05D 2220/40* (2013.01); *H05K 1/165* (2013.01); *H05K 1/185* (2013.01); *H05K 1/189* (2013.01); *H05K 2201/10151* (2013.01)

(56) References Cited

U.S. PATENT DOCUMENTS

| | | | | |
|---|---|---|---|---|
| 6,168,980 | B1* | 1/2001 | Yamazaki | H01L 21/28158 |
| | | | | 257/E21.192 |
| 7,378,721 | B2 | 5/2008 | Frazee et al. | |
| 7,948,229 | B2 | 5/2011 | Weickert | |
| 8,781,772 | B2* | 7/2014 | Clark | G01V 3/104 |
| | | | | 702/66 |
| 9,080,942 | B2* | 7/2015 | Zhong | B82Y 15/00 |
| 9,163,471 | B2* | 10/2015 | Coonrod | E21B 33/0355 |
| 9,618,529 | B2* | 4/2017 | Lerchenmueller | F01D 17/06 |
| 2006/0283232 | A1 | 12/2006 | Lamb et al. | |
| 2007/0139044 | A1* | 6/2007 | Lamb | G01D 11/245 |
| | | | | 324/252 |
| 2007/0268014 | A1 | 11/2007 | Shimomura et al. | |
| 2011/0133950 | A1 | 6/2011 | Subramanian et al. | |
| 2011/0303993 | A1 | 12/2011 | Yamamoto | |
| 2012/0029855 | A1* | 2/2012 | Clark | G01R 33/028 |
| | | | | 702/66 |
| 2012/0156099 | A1* | 6/2012 | Zhong | B82Y 15/00 |
| | | | | 422/82.02 |
| 2013/0074598 | A1 | 3/2013 | Park et al. | |
| 2013/0283919 | A1* | 10/2013 | Coonrod | E21B 33/0355 |
| | | | | 73/632 |
| 2014/0366632 | A1* | 12/2014 | Lerchenmueller | F01D 17/06 |
| | | | | 73/509 |
| 2015/0070004 | A1* | 3/2015 | Lerchenmueller | F01D 17/06 |
| | | | | 324/207.25 |

FOREIGN PATENT DOCUMENTS

| | | | | |
|---|---|---|---|---|
| DE | 102012200091 | A1* | 7/2013 | ............ F01D 17/06 |
| EP | 2 388 816 | A1 | 11/2011 | |
| WO | 2010/025014 | A1 | 3/2010 | |
| WO | 2013/102510 | A1 | 7/2013 | |

OTHER PUBLICATIONS

International Search Report of PCT/CH2014/000124, dated Nov. 28, 2014.
http://en.wikipedia.org/wiki/Silicon_on_insulator, retrieved on Apr. 20, 2016, total of 5 pages.
http://www.flipchip.com/bumping-design-options/bump-heights-130um/sfc-redistribution-spheron-or-bcb, retrieved on Apr. 20, 2016, total of 3 pages.
http://en.wikipedia.org/wiki/FKM, retrieved on Apr. 20, 2016, total of 3 pages.

* cited by examiner

SENSOR DEVICE FOR DETERMINING ROTATIONAL SPEED OF A ROTATABLE OBJECT AND TURBOCHARGER WITH SUCH A SENSOR DEVICE

CROSS REFERENCE TO RELATED APPLICATIONS

This application is the National Stage of PCT/CH2014/00124 filed on Aug. 21, 2014, which claims priority under 35 U.S.C. § 119 of Switzerland Application No. 1471/13 filed on Aug. 29, 2013, the disclosure of which is incorporated by reference. The international application under PCT article 21(2) was published in English.

FIELD OF THE INVENTION

The invention relates to a sensor device for determining rotational speed of a rotatable object, and to a turbocharger with such a sensor device according to the preambles of the independent claims. A rotatable object may e.g. be a compressor wheel of a turbocharger as for example used in automobiles, but shall, not be limited thereto.

BACKGROUND OF THE INVENTION

A turbocharger converts waste energy in the exhaust gas of an automotive engine into compressed air, which is then forced back into the automotive engine. This results in the engine burning more fuel and thus producing more power, while less energy is consumed, thereby improving the overall efficiency of the combustion process. A turbocharger typically comprises a turbine wheel and a compressor wheel, which are connected by a common shaft supported on a bearing system. The turbine wheel is driven by the exhaust gas which in turn drives the compressor wheel, the compressor wheel drawing in and compressing ambient air which is then fed into the engine's cylinders. By means of turbocharging the performance level of smaller engines can be increased up to the performance level of bigger engines without turbocharging, with lower fuel consumption and emissions. Consequently, turbochargers are increasingly employed with diesel and gasoline engines in passenger, commercial, off-road and sport vehicles.

Determining rotational speed of the compressor wheel of a turbocharger is important for optimizing its efficiency, and for ensuring that a turbocharger and engine stay within their respective safe operational ranges. Today's turbochargers need to operate reliably and continuously with increasingly higher exhaust gas temperatures and compressor inlet temperatures. Compared with its diesel counterpart, a modern gasoline turbocharger has to operate, in a much higher underhood temperature environment, with temperatures at the compressor wheel being around 200° C. or above. Modern turbocharger compressor wheels are typically constructed from strong, lightweight conductive materials such as aluminum, titanium or magnesium which can tolerate high stresses. Rotational speed of such compressor wheels can be measured, preferably by means of an active eddy current principle, wherein a magnetic field is generated by an oscillating system and a sensing coil is used to detect compressor blades when they pass through the magnetic field in front of the sensor tip.

Electronic circuits, components and interconnections which are commonly used in automotive applications are typically unable to withstand continuous exposure to temperatures above 150° C. Consequently, turbocharger speed sensors are often realized by connecting the sensor head/sensor tip with the sensing element that is located close to the compressor wheel via a cable to the sensor electronics, which are located in a separate housing at a distance from the turbocharger in a cooler environment within the engine compartment.

However, the separation of sensing element and sensor electronics may lead to higher vulnerability with respect to disturbances from other electronic devices used within the automobile, larger space requirements, higher instability, lower overall performance, decreased signal quality, and higher manufacturing costs. Also packaging, housing, and sealing are duplicated, once for the sensing element and once for the sensor electronics. I.e., manufacturing complexity is increased.

Often sensor electronics are placed inside the same part of the housing segment which is used for connecting the speed sensor to an on-board electronic network of the automobile and/or an engine control unit, which might however have a strong negative impact on signal quality. Also, depending on the particular application the separately located sensor electronics might be increasingly subjected to vibrations, shocks or similar, which might damage the sensor electronics and/or cause their malfunctioning.

Nowadays applications for measurement of turbocharger speed are challenging in that impeller/compressor wheels (the target wheels) are typically very thin (a few tenths of a millimeter; in particular for passenger cars) and therefore deliver a low signal. Also the sensing distance/air gap, i.e., the distance between the sensing element (typically a standard flat coil such as a pancake coil) and the target (the blades), varies as the coil is flat while the interior wall of the turbocharger housing is round/saddle-shaped and the envelope of the impeller/compressor wheel is curved.

Currently, relatively large coils are employed to obtain a strong enough output signal. However, in turbo charger applications there is a need for small sensing elements/coils to permit a small/thin sensor device tip to avoid negative side effects such as hot spots and aerodynamic disturbances which may have a negative impact on the turbocharger's functioning.

With a large flat coil disturbing effects of varying sensing distance/air gap are even stronger, and forming such large coils into a saddle shape is technically difficult. Furthermore, sensor tips with such a large coil are too big to be inserted into small turbochargers of the new generation. The coil is usually connected to the sensor device by welding which, however, is a complex and critical production step.

In DE 10 2009 027 853 A1 the speed sensor is arranged in a recess in the wall of the turbocharger housing with the sensing tip pointing toward the compressor wheel. However, the sensor tip is separated from the inside of the turbocharger by a heat-resistant element. Furthermore, the sensor electronics are located outside of the turbocharger.

Similarly, WO 2013/102510 A1 discloses a speed sensor arranged in the wall of a turbocharger with the sensor tip being separated from the inside of the turbocharger (i.e. the compressor wheel cavity) by a thin wail and a gap between the thin wall and the sensor tip, i.e. the sensor tip is located in a closed or "blind" hole spaced apart from the bottom wail of the blind hole. Electronics such as an application-specific integrated circuit (ASIC) are located in the flange of the sensor housing that is. mounted onto the outside wall of the turbocharger housing. Hence, in both cases the speed sensors need to be separated by a thin wall/a heat-resistant element from the inside of the turbocharger, which may however impair signal quality. Furthermore, the sensor electronics are arranged outside of the turbocharger housing.

U.S. Pat. No. 7,378,721 B2 discloses a speed sensor for a turbocharger, the speed sensor having a cylindrical housing for incorporation into a turbocharger wall. Inside the cylindrical housing a lead frame substrate is arranged that supports at least one electronic component. The electronic component is connected with wire bonds to the lead frame substrate, with the lead frame being encapsulated by a thermoset plastic. Conductive epoxy is used to maintain a connection between the electronic component and the lead frame, The need for a printed circuit board or a ceramic substrate is avoided by using the lead frame substrate. The electronic component may comprise an application-specific integrated circuit (ASIC). The speed sensor can withstand temperatures of approximately 190° C. at the compressor side of the turbocharger.

DESCRIPTION OF THE INVENTION

It is an object of the present invention to provide a sensor device for determining rotational speed of a rotatable object, in particular the compressor wheel of a turbocharger, that can withstand temperatures above 180° C., and in particular operate continuously at temperatures of at least 200° C. while maintaining adequate signal quality and with no need to locate sensor electronics outside the turbocharger in a cooler environment. It is a further object of the invention to provide a turbocharger with such a sensor device.

In order to implement this object, and still further objects of the invention, which will become more readily apparent as the description proceeds, a sensor device is provided, the sensor device comprising a sensor housing with a sensor segment, a mounting segment and a connector segment. The sensor segment and the connector segment are arranged on opposite sides of the mounting segment. A sensing element is arranged at the sensor tip of the sensor segment with the expression "sensor tip" referring to that end of the sensor segment that is furthest away from the mounting segment. Furthermore, sensor electronics are arranged inside the sensing segment, the sensor electronics comprising a silicon-on-insulator (SOI) circuit. The integrated silicon-on-insulator circuit is embedded between flexible or semi-flexible polymer substrates. The sensor electronics may serve for providing input signals to the sensing element and/or to evaluate and/or amplify output signals/measurement signals provided by the sensing element.

Use of a SOI technology has the advantages that parasitic effects are reduced also at high temperatures, thereby leading to a higher temperature working range and Improving performance (see http://en.wikipedia.org/wiki/Silicon_on_insulator).

The integrated SOI circuit is preferably given by an ASIC constructed using SOI technology. Preferentially the integrated SOI circuit is a mixed mode integrated SOI circuit, i.e. an integrated circuit with analogue and digital parts. The integrated SOI circuit preferentially comprises an integrated oscillator, a demodulator, a configuration unit and/or some peripheral blocks such as a power supply and a temperature sensor, if required.

As mentioned, the integrated SOI circuit is embedded between flexible or semi-flexible polymer substrates (such embedding is also called: embedded chip technology or ECT), in a sandwich-like fashion.

The flexible polymer substrates (also called: prints) are, in particular, made, of a liquid crystal polymer (LCP) or polyimide. The term "flexible substrate" shall comprise semi-rigid, in other words semi-flexible, substrates. Both LCP and polyimide have the advantage of being resistant to degradation for temperatures above 180° C., in particular above 200° C., and serve to protect the embedded integrated SOI circuit. Further electronic components, such as silicon capacitors, ferrites and/or protection components, may be embedded between the flexible polymer substrates leading to a thin (e.g., 200 micrometers or less) embedded chip module forming the sensor electronics.

Preferentially, the integrated SOI circuit, in particular the ASIC, further comprises a copper redirection layer (CuRDL; RDL may also stand for redistribution line) which provides an interface between the ASIC and one of the flexible polymer substrates/prints (see http://www.flipchip.com/bumping-design-options/bump-heights-130um/sfc-redistribution-spheron-or-bcb).

Electrical interconnectivity between the SOI circuit and/or other electronic components embedded between the flexible polymer substrates, and (preferably copper) contacts/tracts/pads of the sensor electronics, is provided by vertical electric connections that pass through one of its flexible polymer substrates (defined as the top side) and runs through the CuRDL which redirects the interconnections to and from the integrated SOI circuit. The vertical electric connections may be formed by drilling laser holes or micro vias followed by a semi-additive or similar metallization process. In order to increase the reliability of the interconnections, the use of several, holes or micro vias per pad of the electronic component and/or integrated SOI circuit is preferred.

The other electronic components such as e.g. capacitors are preferable realized as silicon components and are preferentially provided with copper connection pads (or a protective top layer if another metal is used) to avoid forming of intermetallic compounds (IMC). To minimize complexity and costs and to improve lifetime and reliability all electrical connections are preferably realized on the same side (the top side) for the integrated SOI circuit and the other electronic components. As mentioned above, preferably each pad is provided with several vertical electric connections to increase interconnection reliability.

Combining embedded chip technology approach (i.e., sandwiching the integrated SOI circuit and preferably the other electronic components between flexible polymer substrates using ECT) with the provision of a CuRDL provides for placement of electrical contacts in such a way that they do not overlap with respect to the integrated SOI circuit/ASIC and other component (die) pads.

Sandwiching the integrated SOI circuit and preferably also the other electronic components between the flexible polymer substrates using ECT has the advantages of low thermal expansion and minimization of thermo-mechanical stress and shear forces. No additional protection layer (e.g. a conformal coating or epoxy potting) is required.

The sensor device according to the invention advantageously withstands continuous operation and cycling temperatures between −40° C. and at least 200° C. (or above), and preferably at least 250° C. peak temperature. Due to its heat-resistance the sensor device of the invention may be used in new generations of turbocharged gas and diesel engines which as a result of downsizing generate higher ambient temperatures. Also, distance between sensing element and sensor electronics can be minimized, allowing optimized signal quality and lower sensitivity to external disturbances, for example electromagnetic compatibility (EMC) disturbances. Furthermore, the compact size of the sensor device, the high integration level with few interconnections and no need for a cable connecting sensing element and sensor electronics leads to relatively low manufacturing costs. Due to its small size the sensor device of the invention can be easily integrated into a turbocharger and a turbocharger housing, respectively, or similar applications with little redundant space.

Alternatively, it is also possible to mount the integrated 301 circuit and further electronic, components of the sensor electronics onto a high-temperature printed circuit board (PCS) by sintering, the high-temperature printed circuit board, being made e.g. from ceramics or epoxy glass cloth laminates e.g. FR-5, with the contact pads of the integrated SOI circuit and the further electronic components being connected through bonding. However, often the material of available PCBs may not be sufficiently heat-resistant and electronic components, integrated SOI circuit(s) and bonds have to be protected by covering layers and epoxies, which nevertheless may degrade rapidly at temperatures above 150° C.

In one embodiment the sensing element of the sensor device of the invention comprises a double D coil (also called: DD coil), in particular a saddle-shaped DD coil, that is preferentially printed on a flexible polymer substrate (also called: the flexprint approach).

In another embodiment the sensing element of the sensor device of the invention comprises an L coil which is preferentially printed on a flexible polymer substrate (also called: the flexprint approach).

By use of a flexible polymer substrate the DD coil or the L coil can be bent into the required shape, i.e., a shape fitting to the contour/profile of the interior wall of a turbocharger housing. Alternatives to the flexprint approach include the use of low temperature cofired ceramic (LTCC) technology or wound coils. Alternatives to a DD coil or an L coil include the use of a pancake coil.

The sensor device of the invention may be used for: turbocharger compression wheel blade sensing for example in automotive, truck, off-highway vehicle, aerospace or power generation applications. The sensor device of the invention may furthermore be used in any application where rotational speed needs to be measured/detected, in particular in applications of small size and/or with high ambient temperatures and/or where target/object materials are of lower conductivity than aluminium (e.g., impeller blades with thin geometry made of for example titanium).

The invention furthermore relates to a turbocharger with a turbocharger housing and a sensor device according to the invention. A compressor wheel is arranged inside the turbocharger housing. The wall of the turbocharger housing is provided with a recess, in particular a bore hole, in which the sensor segment of the sensor device is positioned such, that both the sensing element and the sensor electronics are located within the wall of the turbocharger housing. The recess or bore hole preferably penetrates through the wall of the turbocharger housing. The sensor segment is in particular positioned such in the recess that its sensor tip is exposed to the compressor wheel but separated from it by a narrow air gap, the narrow air gap preferably being 0.7±0.4 millimeters. The mounting segment of the sensor device is connected to the outside surface of the wall of the turbocharger housing.

As the sensor electronics are positioned within the turbocharger wall they do not require extra space in the engine compartment. Furthermore, the position and the environment of the sensor electronics are known and specified beforehand, which may increase lifetime of the sensor device as it is presumably not subjected for example to any unexpected vibrations or temperatures. Moreover, there is nearly no limitation to the length of the cable harness connecting the sensor device to an on-board electrical system, as due to the proximity of sensing element and sensor electronics there are no significant signal losses because of the amplified signal. Also, flexibility of cable routing within the engine compartment is not restricted as the sensor electronics are integrated in the housing of the turbocharger.

SHORT DESCRIPTION OF THE DRAWINGS

Figure 2:
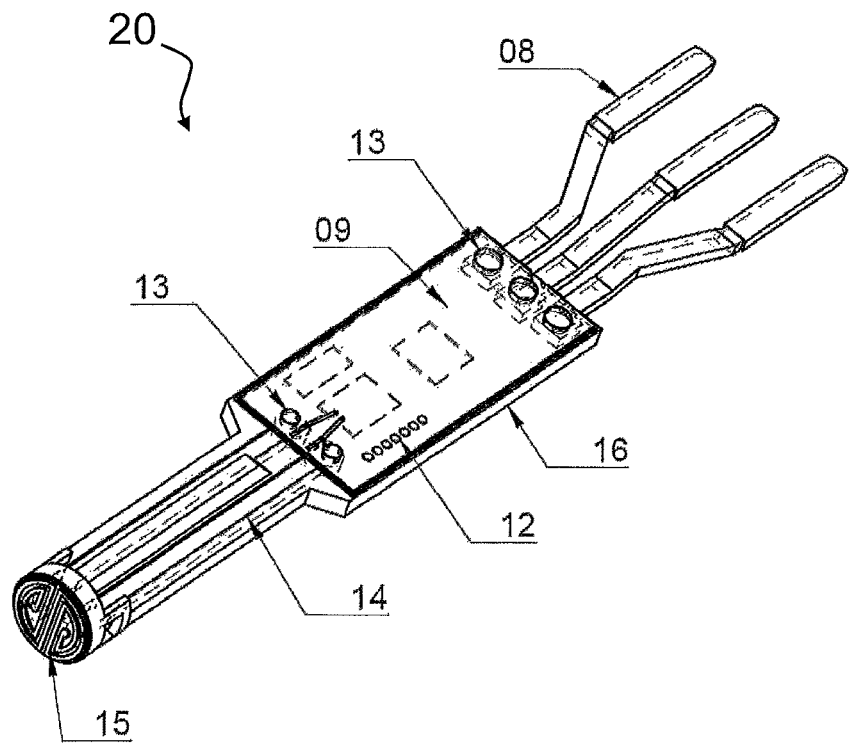
Figure 3:
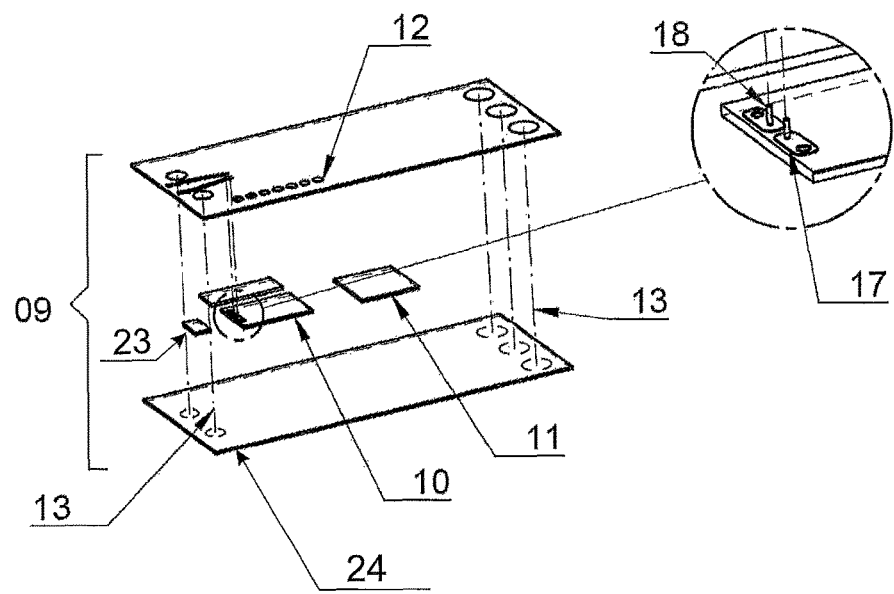
Figure 4:
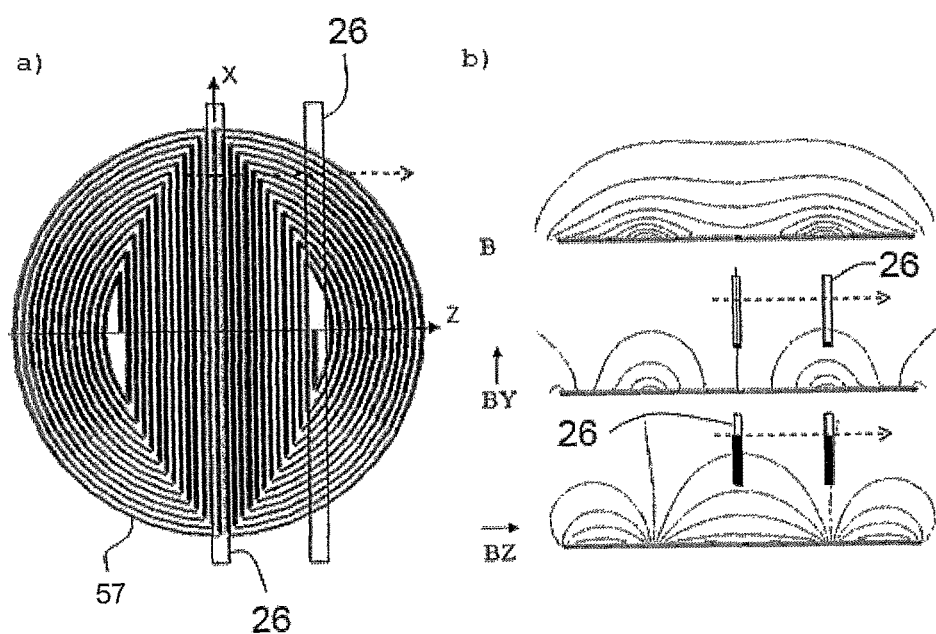
Figure 5:
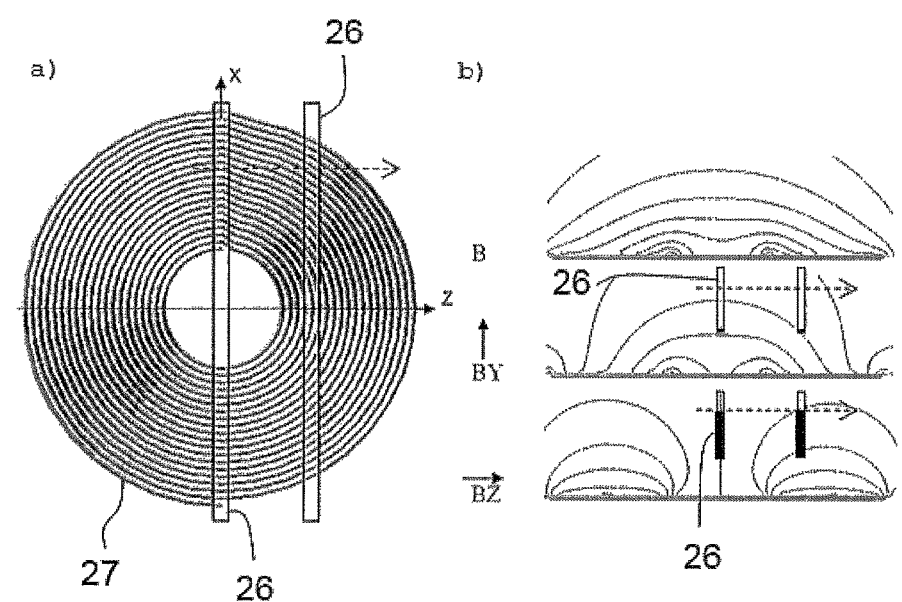
Figure 6:
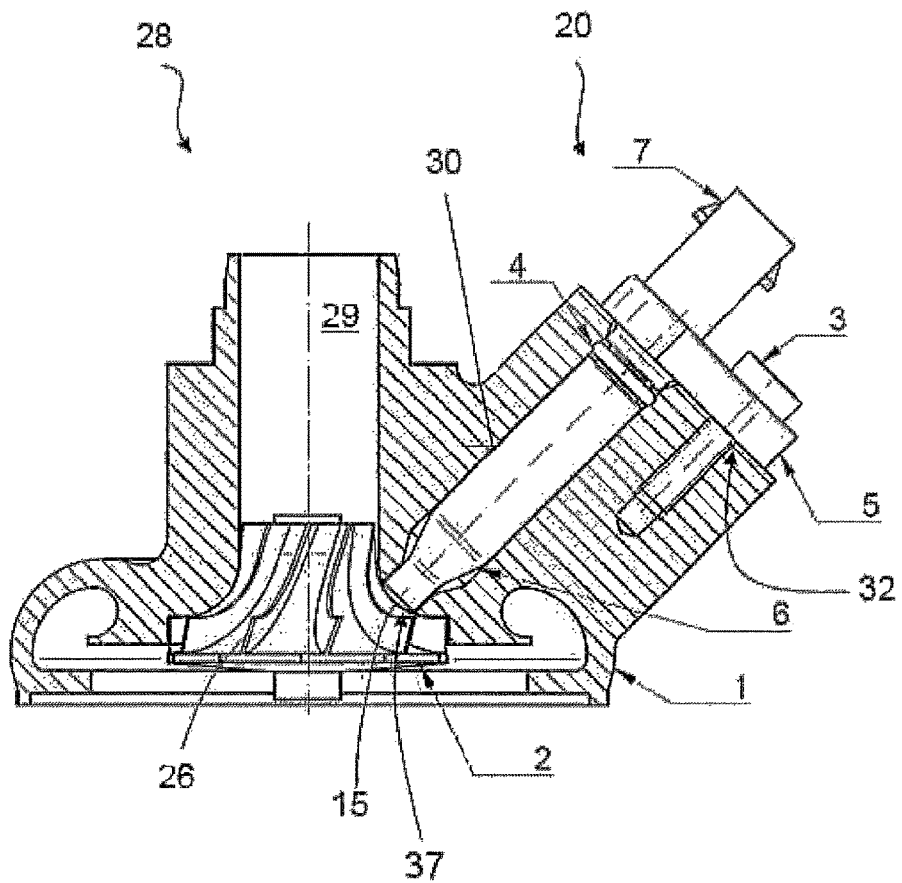
Figure 7:
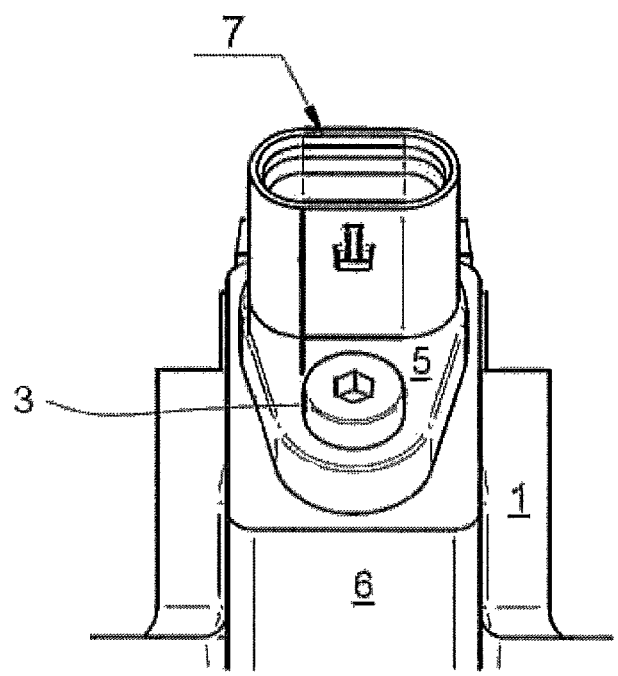
Figure 8:
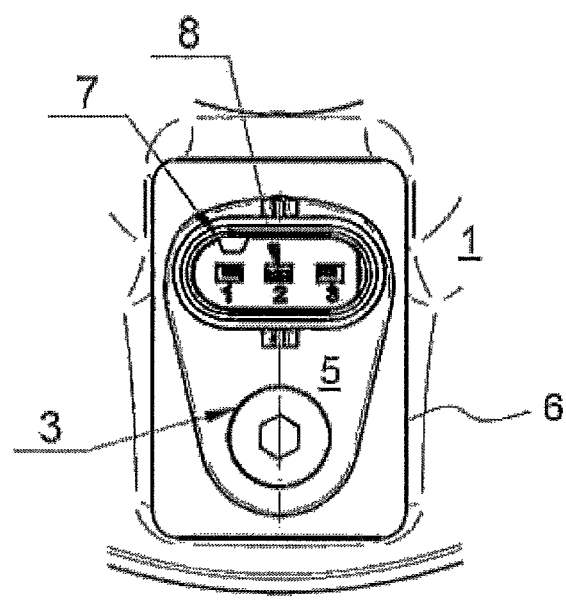
Figure 9:
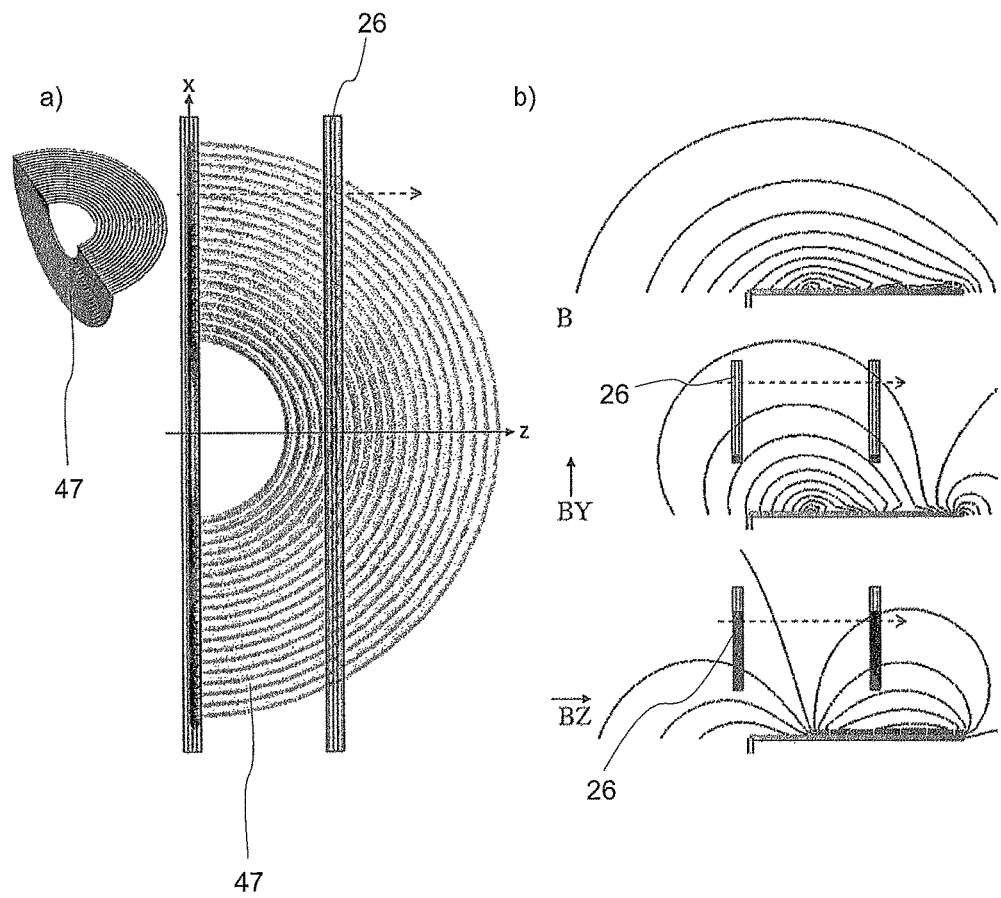

Further advantageous features and applications of the invention can be found In the dependent claims, as well as in the following description of the drawings illustrating the invention. In the drawings like reference signs designate the same or similar parts/components throughout the several figures of which:

FIG. 1 shows a cross-sectional top view of the inside of a sensor device according to the invention, FIG. 2 shows a perspective view of the inside of a sensor device according to the invention with the sensor housing omitted, FIG. 3 shows an exploded view of the sensor-electronics of a sensor device according to the invention, FIG. 4 shows a sensing element in form of a DD coil (FIG. 4a) and corresponding magnetic field curves (FIG. 4b), FIG. 5 shows a sensing element in form o t a pancake coil (FIG. 5a) and corresponding magnetic field curves (FIG. 5b), FIG. 6 shows a cross-sectional view of the sensor device according to the invention mounted in a turbocharging housing, FIG. 7 shows a perspective view of the mounted sensor device according to the invention from the top, FIG. 8 shows a top view of the mounted sensor device according to the invention, and FIG. 9 shows a sensing element in form of a L coil (FIG. 9a) and corresponding magnetic field curves (FIG. 9b).

WAYS OF CARRYING OUT THE INVENTION

FIG. 1 shows a sensor device 20 according to the invention with a sensor housing 21. The sensor housing 21 comprises a sensor segment 6, a mounting segment 5 and a connector segment 7 with the mounting segment 5 connecting the sensor segment 6 and the connector segment 7 such they are on opposite sides of the mounting segment 5. The mounting segment 5 is preferably formed as flange. The sensor electronics 9 are arranged inside the sensor segment 6. The sensing element 15 is arranged at the sensor tip 37, i.e., the end further away from the mounting element 5, of the sensing segment 6. In particular the sensing element 15 is arranged inside the sensor tip 37 of the sensor segment 6, The sensing element 15 and the sensor electronics 9 are connected by contacts 14 which are connected to contact pads 13 of the sensor electronics 9 (see FIG. 2). The sensor electronics 9 and the contacts 14 are preferably mounted on a supporting element 16, in particular a supporting plate (see FIG. 2), which defines the correct place of the sensor electronics 9, the contacts 14 and thereby also the sensing element 15.

The connector segment 7 comprises contact pins 8, in particular for connecting, via a cable, with an on-board electrical system of an automobile typically comprising control units such as an engine control unit. The contact pins 8 are connected to the sensor electronics 9, in particular to contact pads 13 of the sensor electronics 9 (see FIGS. 2 and 3). The electrical connection between the contact pins 8 and the sensor electronics 9/contact pads 13 may be made by soldering, gluing or welding. However, welding is preferred due to the reliability of welded connections in an environment of vibration and high temperatures. The same applies to the electrical connection between the contacts 14 and the sensor electronics 9/the contact pads 13.

Due to the close integration of sensor electronics 9 and sensing element 15 there is nearly no limitation in the length, of the cables (not shown) connecting the contact pins 8 of she connector segment 7 for example to an engine control unit due to the already amplified output signal of the sensor electronics 9.

For the sensor housing 21, in particular the sensor segment 6 and the mounting segment 5, to withstand high temperatures of 200° C. and above the sensor housing 21 is preferably made of one or more organic polymer thermoplastics/thermoplastic resin, for example PEEK (polyether ether ketone). The sensor segment 6 and the mounting segment 5 are preferably formed by directly overmoulding the sensor electronics 9, the contacts 14, the supporting element 16 and preferentially also the outer rim of the sensing element 15. The connector segment 7 may be moulded as a separate piece for insertion into the mounting segment 5. Preferably the sensor segment 6, the mounting segment 5 and the connector segment 7 are moulded together as one piece. For sealing and electrical insulation of the contact pins 8 a sealing element 22 is provided in the connector segment 7 through which the contact pins 8 pass. The sealing element 22 is made of heat-resistant material such as e.g. one or more fluoroelastomers such as FKM (see http://en.wikipedia.org/wiki/FKM).

Referring to FIGS. 2 and 3 the sensor electronics 9 comprise an integrated SOI circuit 10, in particular in form of an ASIC. The sensor electronics 9 may be given by an ECT board. The sensor electronics 9 may further comprise protective electronics components 11 (e.g., for protection against electrostatic discharge (ESD) and noise) and further electronic components 23 such as for example one or more capacitors.

As outlined above the ASIC 10 is constructed using SOI technology and preferably comprises a CuRDL 17. The ASIC 10 is sandwiched between flexible polymer substrates 24 (also called: prints). Further electronic components 11, 23 of the sensor electronics 9 are also preferably sandwiched between the flexible polymer substrates 24. The flexible polymer substrates 24 are preferentially made of a liquid crystal polymer or polyimide. Other heat-resistant flexible polymer materials may also be used. The flexible polymer substrates 24 shall form part of the sensor electronics 9.

The ASIC 10 and the other electronic components 11, 23 of the sensor electronics 9 are preferentially electrically connected by vertical electric connections 18 passing for all components 10, 11, 23 preferably through the same flexible polymer substrate 24 and further through the components 10, 11, 23 until they reach a contact pad (preferably made of copper) of the respective component 11, 23 or (in particular in the case of the ASIC 10) a CuRDL 17. By sandwiching (pre-molding) the electronic components 10, 11, 23 between the flexible polymer substrates 24 thermal stress is minimized when overmolding the sensor electronics 9 with the sensor housing 21.

For configuring/programming the ASIC 10 several configuration pads 12 may be provided on top/in one of the flexible polymer substrates 24 that are electrically connected with the ASIC 10. By means of the configuration pads 12 the ASIC 10 may be configured to meet specific application criteria, for example with respect to the number of blades and/or the rotational speed range of the compressor wheel/impeller of the turbocharger. Additionally or alternatively, the ASIC 10 may be configured via the pins 8 (see also FIG. 8) for example through commands of an engine control unit. After configuration of the ASIC 10 its configuration is preferably protected against overwriting. A parity control may be performed for data integrity.

In particular, the ASIC may be configured for the following parameters/features: number of blades (divider), double pulse suppression, debouncer, output pulse width, maximum frequency range of the output signal, error detection frequency range, detection threshold and hysteresis, short circuit detection time, over temperature shutdown threshold, oscillator trimming, demodulator trimming, bandgap trimming, and/or error flagging disabling and enabling. Error flagging disabling and enabling may especially concern: coilbreak (breaking of the sensing element 15), overtemperature detection (regarding sensor device environment), data-integrity detection, overvoltage and undervoltage detection (e.g. to protect an engine control unit which the sensor device 20 is connected to), frequency error (e.g., whether compressor wheel speed is too low).

Thus, a diagnosis function/system may be incorporated into the ASIC 10 and configured in an application dependent way, the diagnosis system monitoring overvoltage and undervoltage, overtemperature, data integrity, frequency error, coil/sensing element 15 breakage, and/or short circuits.

Also, through appropriate configuration of the ASIC 10 the sensor device 20 of the invention is even more suitable for thin targets, e.g. thin impeller/compressor wheel blades with low conductivity. Furthermore, through appropriate configuration the ASIC 10 and thus the sensor electronics 9 may be matched to the sensing element 15 and its output signal. By appropriately configuring the ASIC 10 it can be adjusted to different applications (e.g., different compressor wheels) and also to different types of sensing elements 15.

In that diagnosis functions can be directly implemented in the ASIC 10, the engine control unit of the customer, to which the sensor device 20 shall be connected, can be designed more simply since diagnosis functionality is shifted to the ASIC 10. The ASIC 10 can then send relevant diagnostic information directly to the engine control unit.

For measuring rotational speed of a rotatable object such as a compressor wheel blade, the sensing element 15 is part of an oscillator tank formed by this coil, a capacitor and the integrated SOI circuit/ASIC 10. This leads to the generation of an electromagnetic field around the sensing element 15, whose magnetic flux lines "step out" of the plane of the sensing element 15. If an electrically conducting target/object such as an impeller/compressor blade 26 approaches the sensing element. 15, the magnetic flux lines pass through the blades 26 and induce eddy currents therein. The eddy currents within the blades 26 also generate an electromagnetic field counteracting the electromagnetic field generated by the sensing element 15, thereby affecting the impedance of the sensing element 15, and therefore the oscillation frequency. The eddy current effect increases when a blade 26 approaches the sensing element 15. The changing impedance of the sensing element 15 is reflected in modulating the oscillation frequency. Evaluating this frequency by the sensor electronics 9 and/or an engine control unit results in current or voltage signals that correspond to the rotational speed of the impeller/compressor wheel blades 26, such that the rotational speed can be determined.

Referring to FIGS. 2 and 4 the sensing element 15 is realized by a coil, in particular by a double D coil 57 (also called: DD coil) in the embodiment according to FIG. 4. Other coil configurations/shapes are also possible. Preferred coil types will be described below in connection with FIG. 5 and 9. The material of the DD coil 57 is preferably low resistivity one like copper or silver. The spacings of the lines (curved and uncurved) are in particular chosen such that the DD coil 57 has a small size/diameter with a diameter of for example 3.6 millimeters, considering the required physical properties of the DD coil 57. With such a small diameter of the DD coil 57 a small/thin sensor device tip (a small distal end of the sensor device 20), and a thin sensor segment 6, may be realized, for example with a diameter of not more than 4.5 millimeters at the sensor tip 37 and 8.2 millimeters for the shaft of the sensor segment 6. Consequently, the recess (e.g., a bore hole) in the turbocharger housing, in which the sensor segment 6 shall be inserted, needs also only to be small in diameter, for example having an inner diameter of slightly more than 4.5 millimeters. The smaller such recess/bore hole, the better the performance and efficiency of the turbocharger.

Preferentially, the DD coil 57 is printed onto a flexible polymer substrate 25 (also called: print)—instead of being wound—to further ensure small size. By use of the flexible polymer substrate 25 the DD coil 57 can be easily bent into an appropriate shape, i.e., a shape corresponding to the shape of the interior wall of the turbocharger housing at the location where the sensing element 15 shall be arranged. The flexible DD coil 57 may thus be bent into a three-dimensional shape, preferably into a saddle-shaped form. The material for the flexible polymer substrate 25 is chosen to be highly heat-resistant, in particular to withstand temperatures at least up to 200° C., preferably at least up to 230° C. Suitable materials are for example liquid crystal polymers or polyimides. The flexible polymer substrate 25 also protects the DD coil against breakage as it may otherwise break due to its inherent fragility.

The flexible polymer substrate 25 may be realized by one of the flexible polymer substrates 24 of the sensor electronics 9 which simplifies the connection between the sensing element 15 and the sensor electronics 9 and may reduce internal connections.

In addition to printing the DD coil 57 onto the flexible polymer substrate 25 various technologies may be used for integration of the DD coil 57, such as for example LTCC (low temperature co-fired ceramic) technology. This allows for flexible adoption of coil integration depending on the particular ambient conditions such as very high temperature applications and mechanical strength.

Due to its shape/geometry (see FIGS. 2 and 4) the DD coil 57 is especially well suited to detect/measure changes of its magnetic field caused by thin blades 26 (in particular with a thickness below 1 millimeter). The shape of the output signal of the DD coil 57 is also well suited for further analysis and evaluation for example by the sensor electronics 9 and/or an engine control unit.

Because of the preferred saddle-shaped form of the DD coil 57 it must be adequately oriented to the blades/targets 26 such that the magnetic field generated by the DD coil 57 is influenced by ("senses") a larger effective target/blade surface, thereby increasing the modulation of the impedance and thus the output signal of the DD coil 57 through retroaction of higher eddy currents induced into the blades 26.

FIGS. 4, 5 and 9 show a comparison of the DD coil 57, a typically employed pancake coil 27 and an L coil 47 respectively, and the magnetic fields B generated by them. "X", "Y", and "Z" denote the respective directions. The dashed arrows indicate the direction of target/blade 26 movement. In the diagrams in FIGS. 4b), 5b) and 9b) the black areas/parts of the targets/blades 26 are the areas/parts of the targets/blades 26 "sensed" and thus most influenced by the respective components BY (in the Y-direction) and BZ (in the Z-direction) of the magnetic field of the coils 57, 27, 47.

For the pancake coil 27 there is a "dip" (i.e., a valley within a double pulse) in the output signal when the target/blade 26 is located at the middle of the coil 27 where there is no magnetic field component BZ in the Z-direction. The magnetic field component BY in the Y-direction cannot compensate for this due to the small effective area/parts seen by the magnetic field BY in the Y-direction.

For the L coil, the field of the left side of FIG. 9b) is strongly reduced, thereby reducing the signal delivered by this part and therefore reducing the "dip" effect, whilst retaining the signal amplitude On the other hand, for the DD coil 57 the magnetic field component BZ in the Z-direction affects/"senses" a large area/part of the blades 26 when they are in the middle or on the sides of the DD coil 57. The magnetic field component BY in the Y-direction is only slightly affected by the corresponding small effective areas/parts of the blades 26. Thus, the particular geometry of the DD coil 57 strongly decreases or may even entirely suppress the dip/valley in the output signal observed with conventional pancake coils 27, also when used for detecting thin blades 26. Hence, use of the DD coil 57 results in a sharper signal shape for stable signal processing (compared with use of the pancake coil 27), but with drawback of a lower signal amplitude The DD coil 57 may be provided with a supplemental layer, which may be realized as a 2-layer coil in order to strengthen the magnetic field it generates and to increase signal strength.

The three-dimensional, in particular saddle-shaped, form of the sensing element/DD coil 57 and the resulting three-dimensional, in particular saddle-shaped form, of the tip/head of the sensing element 6 of the device 20 can follow the inside/inner contour of the turbocharger housing. Thereby air flow vortexes/swirls causing hot spots that would increase the temperature on the sensor tip (the distal end of the sensor device 20) can advantageously be avoided, which otherwise might impact on the efficiency of the turbocharger.

Furthermore, a more constant air gap/sensing distance can be achieved between the DD coil 57 and the target/blade 26 over the entire surface of the DD coil 57 which leads to strengthening and increased accuracy of the output signal of the DD coil/sensing element 57.

FIGS. 6, 7 and 8 show (part of) a turbocharger 28 with a turbocharger housing 1, a compressor wheel 2 and a compressor inlet 29 inside the housing, the compressor wheel 2 is connected to a turbine wheel by a shaft (not shown). The turbocharger housing 1 is provided with a recess in form of a hole 30, in particular a cylindrical hole such as a bore hole, that preferably passes entirely through the wall of the turbocharger housing 1 in the direction toward (the blades 26 of) the compressor wheel 2.

The sensor device 20 of the invention is inserted into the cylindrical hole 30 with its preferably shaft-like sensor segment 6 until its mounting segment 5 abuts on the wall of the turbocharger housing 1 from the outside. The connector segment 7 points away from the turbocharger housing 1, The distal end of the sensor segment 6 with the sensing element 15 is located at the inside opening of the cylindrical hole 30 such that the rotating blades 26 pass by it at a short distance.

The outer diameter of the sensor segment 6 basically corresponds to the inner diameter of the cylindrical hole 30 such that the sensor segment 6 tightly fits into the cylindrical hole 30. For secure placement within the cylindrical hole 30 an annular sealing element 4 surrounds the sensor device 6 inside the cylindrical hole 30 to provide a secure and tight fit of the sensor device 20 within the cylindrical bore 30. The annular sealing element 4 is preferably provided at the transition from the sensor segment 6 to the mounting segment 5. The annular sealing element 4 is preferably given by a heat-resistant fluoroelastomer O-ring seal that can withstand temperatures of at least 200° C.

The mounting segment 5 is preferably formed as a flange with an insert hole 32 through which a bolt 3 or other securing means can be passed for secure attachment of the sensor device 20 on the outside of the turbocharger housing 1. The sensing element 15 and the sensor electronics 9 are integrated into the shaft 6 of the sensor device 20 and thus located inside the wall of the turbocharger housing 1.

It is to be understood that while certain embodiments of the present invention have been illustrated and described herein, it is not to be limited to the specific embodiments described and shown. Therefore, terms like, "preferred" or "in particular" or "particularly" or "advantageously", etc. signify optional and exemplary embodiments only.

The invention claimed is:

1. Sensor device for determining rotational speed of a rotatable object, comprising a sensor housing with a sensor segment, a mounting segment and a connector segment, the sensor segment and the connector segment being arranged on opposite sides of the mounting segment, wherein a sensing element is arranged at a sensor tip of the sensor segment, wherein sensor electronics are arranged inside the sensor segment, the sensor electronics comprising an integrated silicon-on-insulator circuit, such that the sensor device can withstand continuous operating temperatures of at least 200° C., wherein the integrated silicon-on-insulator circuit is embedded between flexible polymer substrates.

2. Sensor device according to claim 1, wherein the integrated silicon-on-insulator circuit further comprises a copper redirection layer.

3. Sensor device according to claim 1, wherein the material of the flexible polymer substrates comprises liquid crystal polymer and/or polyimide.

4. Sensor device according to claim 1, wherein the integrated silicon-on-insulator circuit is provided with vertical electric connections passing through one of the flexible polymer substrates.

5. Sensor device according to claim 1, wherein the integrated silicon-on-insulator circuit is given by an ASIC.

6. Sensor device according to claim 1, wherein the sensor housing is made of an organic polymer thermoplastic.

7. Sensor device according to claim 1, wherein the sensing element comprises a double D coil.

8. Sensor device according to claim 1, wherein the sensing element comprises an L coil.

9. Sensor device according to claim 7, wherein the double D coil is printed on a flexible polymer substrate.

10. Turbocharger with a turbocharger housing and a sensor device according to claim 1, wherein a compressor wheel is arranged inside the turbocharger housing and the wall of the turbocharger housing is provided with a recess in which the sensor segment of the sensor device is positioned such that both the sensing element and the sensor electronics are located within the wall of turbocharger housing, wherein the mounting segment of the sensor device is connected to the outside surface of the wall of the turbocharger housing.

11. Sensor device according to claim 1, wherein the sensing element comprises a saddle-shaped double D coil.

12. Sensor device according to claim 8, wherein the L coil is printed on a flexible polymer substrate.

* * * * *